United States Patent [19]

Arnborg

[11] Patent Number: 5,128,741
[45] Date of Patent: Jul. 7, 1992

[54] METHODS PRODUCING ON A SEMI-CONDUCTOR SUBSTRUCTURE A BIPOLAR TRANSISTOR, OR A BIPOLAR AND A FIELD EFFECT TRANSISTOR OR A BIPOLAR AND A FIELD EFFECT TRANSISTOR WITH A COMPLEMENTARY FIELD EFFECT TRANSISTOR AND DEVICES RESULTING FROM THE METHODS

[75] Inventor: Bengt T. Arnborg, Stockholm, Sweden

[73] Assignee: Telefonaktiebolaget L M Ericsson, Stockholm, Sweden

[21] Appl. No.: 585,644

[22] Filed: Sep. 20, 1990

Related U.S. Application Data

[60] Division of Ser. No. 515,679, Apr. 26, 1990, Pat. No. 5,001,074, which is a continuation of Ser. No. 365,968, Jun. 13, 1989, abandoned.

[30] Foreign Application Priority Data

Jun. 16, 1988 [SE] Sweden ................. 8802264

[51] Int. Cl.$^5$ ................. H01L 29/72; H01L 27/02; H01L 29/04
[52] U.S. Cl. ................. 357/43; 357/34; 357/42; 357/46; 357/59
[58] Field of Search ................. 357/34, 42, 43, 46, 357/59

[56] References Cited

U.S. PATENT DOCUMENTS

| | | |
|---|---|---|
| 4,110,779 | 8/1978 | Rathbone et al. . |
| 4,175,983 | 11/1979 | Schwabe . |
| 4,191,585 | 3/1980 | Aomura et al. . |
| 4,333,774 | 6/1982 | Kamioka . |
| 4,400,711 | 8/1983 | Avery ................. 357/46 |
| 4,434,543 | 3/1984 | Schwabe et al. . |
| 4,445,268 | 5/1984 | Hirao . |
| 4,486,942 | 12/1984 | Hirao . |
| 4,507,847 | 4/1985 | Sullivan . |
| 4,533,934 | 8/1985 | Smith ................. 357/49 |
| 4,558,508 | 12/1985 | Kinney et al. . |

(List continued on next page.)

FOREIGN PATENT DOCUMENTS

| | | |
|---|---|---|
| 0097379 | 1/1984 | European Pat. Off. . |
| 0219831 | 4/1987 | European Pat. Off. . |
| 0263756 | 4/1988 | European Pat. Off. . |
| 52-26181 | 2/1977 | Japan . |
| 60-20571 | 1/1985 | Japan . |
| 61-136255 | 6/1986 | Japan . |
| WO85/04285 | 9/1985 | World Int. Prop. O. . |

OTHER PUBLICATIONS

S. M. Sze, *Semiconductor Devices Physics and Technology*, John Wiley & Sons, New York (1985) p. 211.
"Bipolar Device Incorporated Into CMOS Technolgy," *IBM Tech. Disclosure Bulletin*, vol. 5, No. 9, Feb. 1986, pp. 3813-3815.

(List continued on next page.)

Primary Examiner—J. Carroll
Attorney, Agent, or Firm—Burns, Doane, Swecker & Mathis

[57] ABSTRACT

An area (7a) on epitaxial layer (2a) is doped negatively (n). A thick oxide layer (16) is grown around an active area of a bipolar transistor (BIP) and field effect transistor (FET). The active area is oxidized to an oxide layer (19) which is coated with a polycrystalline silicon layer (20a). A weak positive LDD doping, is carried out in an area (P) between this silicon layer (20a) and the silicon dioxide layer (16). A heavily negative doping (n+) is carried out on one side of the polycrystalline layer (20a) for constituting emitter (E) of the bipolar transistor (BIP). Its collector consists of the doped epitaxial layer (7a) which is connected to a polycrystalline layer (20c) on the silicon dioxide layer (16). A heavy, positive doping (p+) is carried out on the other side of the polycrystalline layer (20a) to constitute collector/emitter of the (FET), which is connected to the bipolar transistor (BIP) in a Darlington circuit. The method permits the production of a bipolar transistor by itself and also the production of the Darlington circuit.

1 Claim, 7 Drawing Sheets

U.S. PATENT DOCUMENTS

| | | | |
|---|---|---|---|
| 4,590,664 | 5/1986 | Prentice et al. | 357/34 |
| 4,613,885 | 9/1986 | Haken . | |
| 4,622,738 | 11/1986 | Gwozdz et al. . | |
| 4,651,409 | 3/1987 | Ellsworth et al. . | |
| 4,654,269 | 3/1987 | Lehrer | 357/54 |
| 4,677,739 | 7/1987 | Doering et al. | 357/92 |
| 4,694,319 | 9/1987 | Kusaka . | |
| 4,753,709 | 6/1988 | Welch et al. | 357/59 |
| 4,769,560 | 9/1988 | Tani et al. | 357/46 |
| 4,816,423 | 3/1989 | Havemann . | |
| 4,825,274 | 4/1989 | Higuchi et al. . | |
| 4,830,973 | 6/1989 | Mastroianni . | |
| 4,855,244 | 8/1989 | Hutter et al. . | |
| 4,859,630 | 8/1989 | Josquin . | |
| 4,902,640 | 2/1990 | Sachitano et al. | 357/59 |

OTHER PUBLICATIONS

Parrillo et al., "A Verstile High-Performance, Double-Level-Poly Double-Level-Metal, 1.2-Micron CMOS Technology", IEDM, 1986, pp. 244–247.

"Insulated Gate Transistor Modeling and Optimization"; Yilmaz et al, IEEE International Electron Devices Meeting, 1984, pp. 274–277.

"Lightly Doped Drain Structure For Advanced CMOS (Twin-Tub IV)"; Lee et al., IEEE Internation Electron Devices Meeting, 1985, pp. 242–245.

"Process and Device Considerations for Micron and Submicron CMOS Technology"; Parillo, IEEE International Electron Devices Meeting, 1985, pp. 398–402.

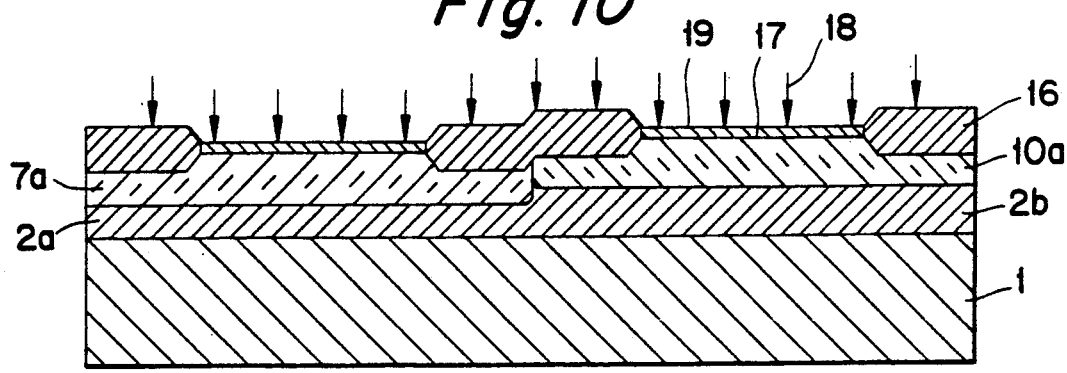
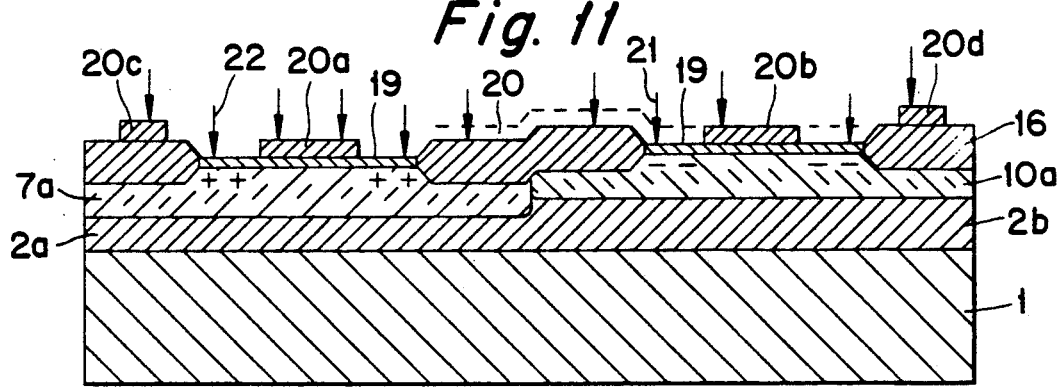
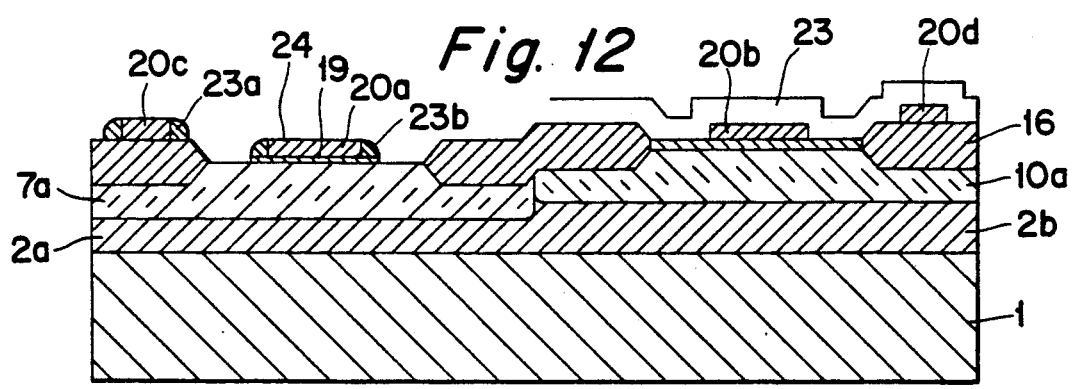
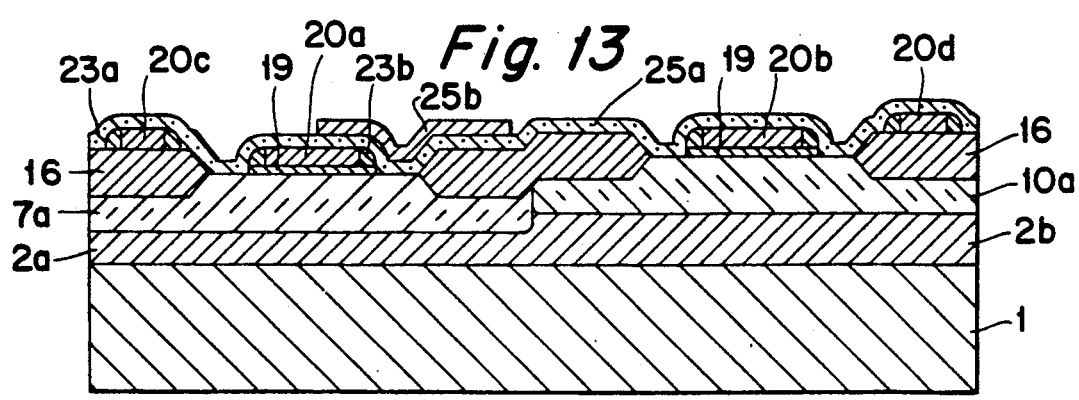

METHODS PRODUCING ON A SEMI-CONDUCTOR SUBSTRUCTURE A BIPOLAR TRANSISTOR, OR A BIPOLAR AND A FIELD EFFECT TRANSISTOR OR A BIPOLAR AND A FIELD EFFECT TRANSISTOR WITH A COMPLEMENTARY FIELD EFFECT TRANSISTOR AND DEVICES RESULTING FROM THE METHODS

This application is a division, of application Ser. No. 07/515,679, field Apr. 26, 1990, U.S. Pat. No. 5,001,074, which is a continuation of application Ser. No. 07/365,968, field Jun. 13, 1989, and now abandoned.

TECHNICAL FIELD

The present invention includes methods of producing on a substructure of semiconductor material is bipolar transistor or a bipolar transistor connected to a field effect transistor, or a bipolar transistor and a field effect transistor with a field effect transistor complemental to said field effect transistor, the method including the following procedural steps:
  an eptitaxial layer of the semiconductor material is grown on the substructure, which is of single crystal material;
  the epitaxial layer is doped to a desired depth and with desired positive or negative type of doping substances;
  a thick semiconductor oxide layer is grown on the epitaxial layer about an area which is intended to constitute the active area of said transistors;
  the surface of this active area is oxidized to a thin oxide layer on which heavily doped polycrystalline semiconductor material is deposited in a layer which partially covers the active area and divides it into a first and a second active area;
  the remaining parts of the active area, said active partial areas, are weakly doped with substances which are of a opposite type to the doping substances for the epitaxial layer;
  semiconductor oxide is deposited in edge areas of the polycrystalline layer and said thin oxide layer is etched away in the active partial areas outside these edge areas of the semi-conductor oxide.

The invention also includes apparatuses which can be produced in accordance with the method.

BACKGROUND ART

Semiconductor amplifiers are produced in many electrical circuits as so-called Darlington circuits comprising two transistors mutually connected in series. In the international patent application WO 85/04285, such amplifier devices are shown which have a bipolar transitor and a FET side by side on a common substructure. The transistors are mutually connected via a metal layer on the substructure surface. This device has the disadvantage that it is complicated to produce and requires a large area for the common substructure. There is also shown a Darlington circuit where the bipolar transistor is divided into a plurality of segments, each of which is surrounded by segments of the FET. The mutual substructure is thus utilized effectively and the device takes up a small amount of room, but has the disadvantage that it is relatively complicated to produce.

In the production of FET's, so-called complementary methdos can be utilized, as are described in a conference report IEEE 1986 International Electron Devices Meeting Technical Digest, Los Angeles 7-10 Dec, pp 244-247, L. C. Parillo et al: "A Versatile, High-Performance, Double-Level-Poly Double Leve Metal, 1.2 Micron CMOS Technology". Two FET's are produced on a common substructure, one in a positively doped and the other in a negatively doped area. The method has the advantage that the two transistors can be manufactured using a relatively small number of procedural steps. However, the transistors shown are not connected in a Darlington circuit and it is not apparent, in the use of this method, whether the FET's can be connected to a still further component on the substructure.

DISCLOSURE OF INVENTION

A Darlington circuit with a mutually connected FET and a bipolar transistor are produced in accordance with the invention by a method having relatively few procedural steps. The invention method has advantages in comparison with the prior art, particularly in a complemental manufacturing method for two FET's one of which being included in a Darlington circuit.

A bipolar transistor can also be produced in accordance with the inventive method and with relatively few procedural steps.

The inventive methods for producing a Darlington circuit with a bipolar transistor and a FET, a Darlington circuit and a FET complementary to the FET in the Darlington circuit or only a bipolar transistor are substantially the same in all three cases. The methods differ from each other to some extend, but the inventive idea is the same in all the methods.

The invention also comprises devices with a Darlington circuit with a bipolar transistor and a FET, a Darlington circuit and a FET complementary to the FET in the Darlington circuit and a bipolar transistor only. The invention devices can be produced making use of the inventive methods.

The invention has the features recited in the accompanying claims.

BRIEF DESCRIPTION OF DRAWINGS

An embodiment of the invention will now be described in more detail below in connection with drawings, where FIG. 1 schematically illustrates an FET and a bipolar transistor connected to each other, FIGS. 2-17 each illustrate a cross section of a semiconductor substructure which, in the individual figures is coated with a number of layers of different materials.

BEST MODE FOR CARRYING OUT THE INVENTION

Figure 1:
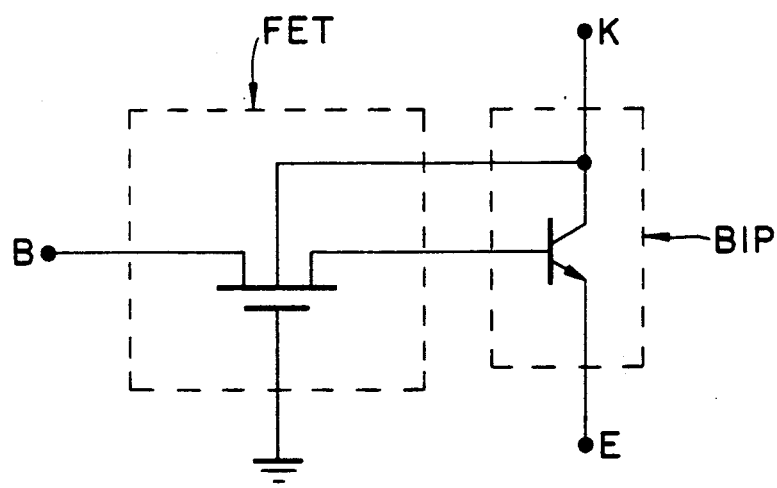

A field effect transistor FET and a bipolar transistor BIP connected in a Darlington circuit are shown schematically in FIG. 1. The collector and emitter of the bipolar transistor BIP are connected to exterior connections K and E. The transistor base is connected to the emitter of the FET, the collector of which is connected to an outer connection B. In a known method, two FET's are produced on a common substructure, one transistor in a positively doped layer and the other in a negatively doped layer. This method is usually known as the complementary method oxide semiconductor (CMOS) process1. The method which will be described below utilises this known method to a certian extent. By altering the known method in an inventive way, a Darlington circuit with the bipolar transistor BIP and the FET can be produced.

Figure 2:
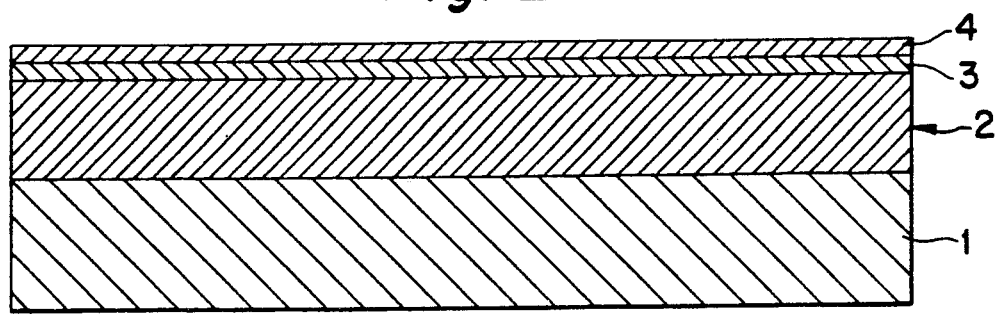
Figure 3:
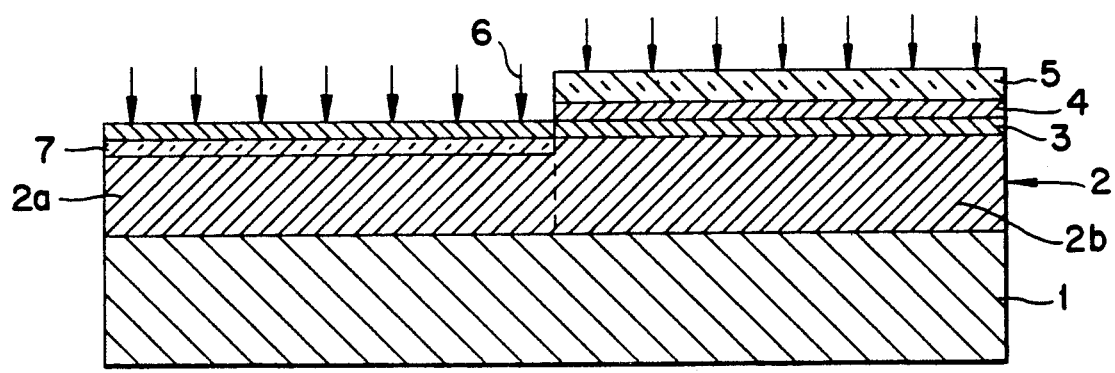
Figure 4:
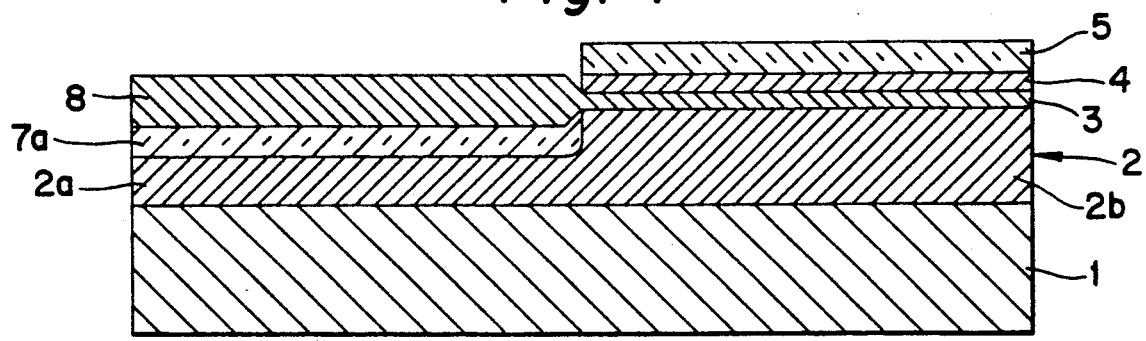
Figure 5:
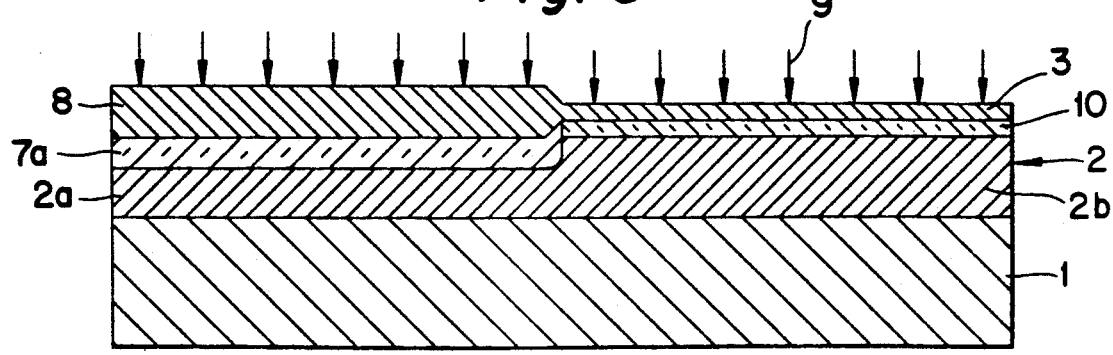
Figure 6:
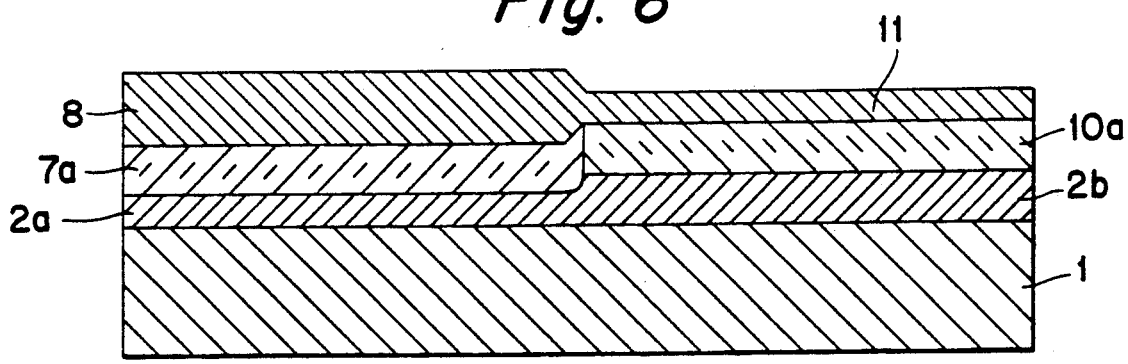
Figure 7:
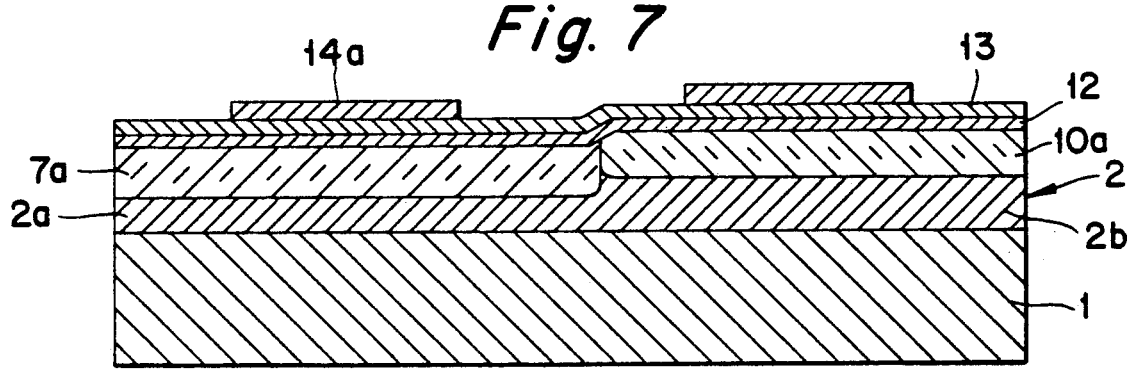
Figure 8:
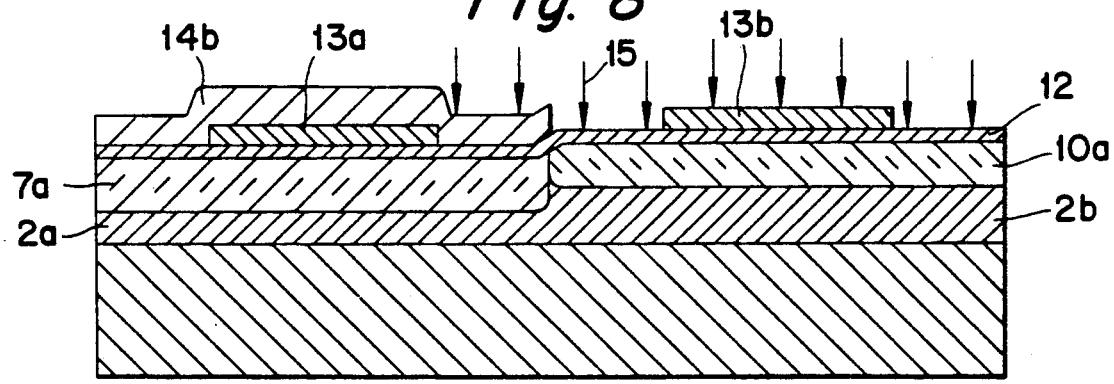
Figure 14:
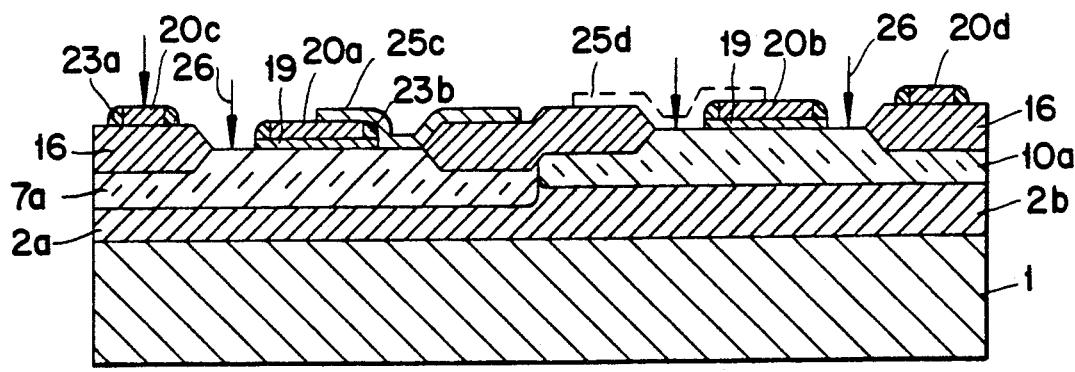
Figure 15:
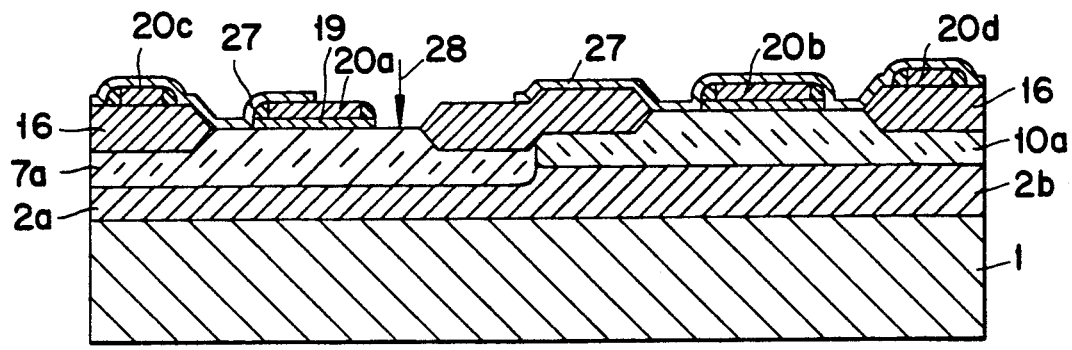
Figure 16:
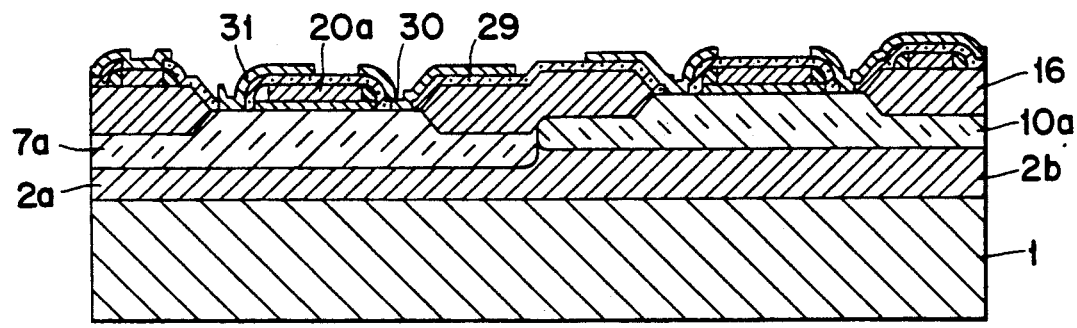
Figure 17:
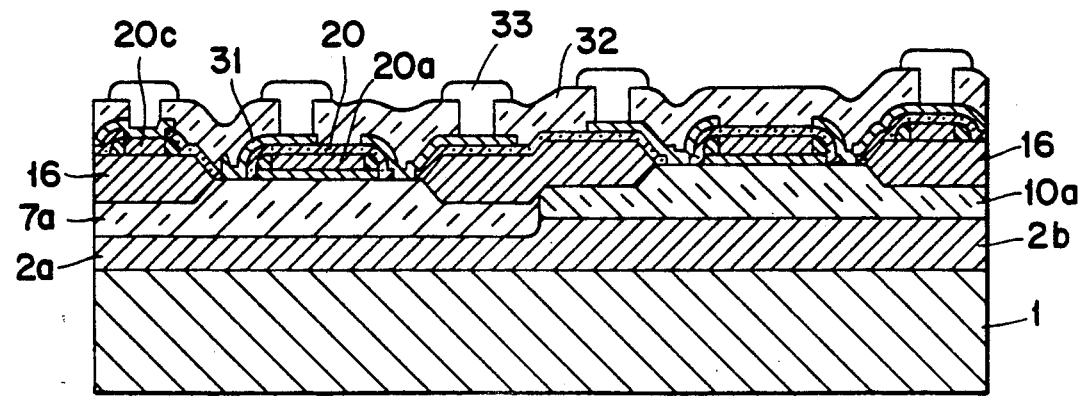

In FIG. 2 there is shown a single crystal substructure 1, in this example silicon, wich is heavily negatively doped. A weakly negatively doped epitaxial layer 2 of silicon has been grown on the substructure, and the surface of this layer has been oxidized to a silicon oxide layer 3. A layer 4 of silicon nitride has been in turn deposited on this oxide layer 3, and the right hand half (in FIG. 3) of the layer 4 has been coated with a layer 5 of photo-resistive material. The silicon nitride layer 4 has been eteched away on the remaining part of the substructure, i.e. the left hand half. This left hand half 2a of the epitaxial layer 2 has been doped negatively with phosphor ions 6 by ion implantation. These ions penetrate through the oxide layer 3 and into a surface layer 7 in the epitaxial layer 2a, the photo-resistive layer 5 and nitride layer 4 protecting the right hand half 2b of the epitaxial layer 2 against the ions 6. The oxide layer 3 assists in spreading the ions 6 so that they are uniformly distributed in the surface layer 7. The left hand part 2a of the epitaxial layer 2 is oxidized at increased temperature to a thick silicon dioxide layer 8, as illustrated in FIG. 4. The ions 6 in the layer 7 diffuse into the epitaxial layer 2a, to a negatively doped layer 7a. The silicon nitride layer 4 inhibits the oxidization of the right hand part 2b of the epitaxial layer. THe photo-resistive layer 5 and the silicon nitride layer 4 are then etched away as illustrated in FIG. 5. Positively doped boron ions are implanted in a surface layer 10 in the right hand part 2b of the epitaxial layer 2. The ions are spread in this layer by the silicon dioxide layer 3 and the silicon dioxide layer 8 protects the negatively doped layer 7a against the positive ions 9 at this ion implantation. At renewed oxidation the thickness of the silicon dioxide layer 3 grows over the right hand part 2b of the epitaxial layer 2. A thick oxide layer 11 is thus formed, as illustrated in FIG. 6, and the layer 8 over the left hand part 2a of the epitaxial layer also grows in thickness. In this oxidation, the boron ions 9 are driven into the layer 10 so that a positively doped layer 10a formed, subsequent to which the oxide layers 8 and 11 are etched away. The surface of the layers 7a and 10a are then oxidized once again into a thin silicon dioxide layer 12, on which a silicon nitride layer 13 is deposited, as illustrated in FIG. 7. A photo-resistive mask 14a is applied over the silicion nitride layer 13 and parts of this layer are etched away as illustrated in FIG. 8. Parts 13a and 13b remain of the layer 13 to cover the active areas of the future transistors. A photo-resistive mask 14b is applied over the negatively doped area 7a in the left hand half of the figure, ions 15 then being implanted in the layer 10a. The ions 15 are positive ions with low energy and negative ions with high energy which penetrate through the nitride layer 13b. The negatively doped layer 7a is protected during this ion implanation by the mask 14b. The mask is removed and the thin silicon dioxide layer 12 is oxidized further to a thick silicon dioxide layer 16, as will be seen from FIG. 9. The nitride layers 13a and 13b are then etcher away, the oxide layer 12 under the nitride layer also being attached. A thin silicion dioxide layer 17 is once again oxidized over the active areas where the silicon nitride layers 13a and 13b were situated, as will be seen from FIG. 10. The silicion dioxide layer 17 is utilized to spread ions in a renewed ion implanation with positivie ions 18 which is carried out in these areas to obtain desired degrees of doping. The thin oxide layer 17 is then etched away and a new layer 19 of silicon dioxide is applied in its place. This layer will constitute a part of the ready transistors, and it is important that the silicon dioxide is pure and that the layer 19 has a uniform thickness of about 250 angstrom. A layer 20 of polycrystalline silicon is deposited on top of the thick silicon dixoide layer 16 and the thin silicon dioxide layer 19, the polycrystalline layer being indicated by dashed lines in FIG. 11. The layer 20 is heavily doped and is provided with a mask of photo-resistive material. With the aid of this mask (unillustrated in the Figure) parts of the layer 20 are eteched away so that only parts 20a and 20b remain on the silicon dioxide layer 19, as well as parts 20c and 20d on the silicond dioxide layer 16. This etching is done with an anisotropic etching method so that the areas 20a, 20b, 20c and 20d obtain straight and well defined edges. The remaining parts 20a and 20b of the polycrystalline layer thus divide each of the both active areas into two active partial areas. The photoresistive mask is removed and a thin protective skin of silicon dioxide is developed on the silicon polycrystalline layers 20a, 20b, 20c and 20d. Negative ions 21 are implanted in a low concentration about the layers 20a and 20b. The evens out the doping concentration at the transition between the heavily doped area 20b and the substructure 10a. This doping is referred to as Lightly Doped Drain (LDD), doping which also takes place about the area 20a, but here the concentration differences between this area and the substructure 7a are increased. To counteract this doping about the area 20a, a photo-resistive mask (not illustrated in the Figure) is applied over the layer 10a and the area about the polycrystalline layer 20a is weakly counter-doped with positive ions 22, which constitutes the LDD doping in the layer 7a. The photo-resistive mask is removed and silicon dioxide is deposited in a uniform layer 23 over the entire substructure as indicated in the right hand part of FIG. 12. This silicon dioxide layer 23 is then etched using an anisotropic-acting etching liquid, so that only the silicon dioxide edge areas 23a and 23b remain about the polycrystalline layers, as illustrated in the left hand part of the Figure. The thin protective layer of silicon dioxide on the polycrystalline layers is attacked by this anisotropic etching. These layers are therefore oxidized once again so that they are covered by a very thin, protective layer 24 of silicon dioxide. The edge areas 23b along the edges of the polycrystalline layers 20a and 20b have the task of protecting the above-described LDD doping during a heavy ion implantation, which will be described below. A layer 25a of silicon nitride is deposited over the entire device, as illustrated in FIG. 13, before this heavy ion implantation. The silicon nitride layer 25a is provided with a photo-resistive mask 25b so that desired parts of the nitride layer 25a can be etched away. In accordance with the invention, the photo-resistive mask 25b only covers the part of the surface of the device above the negatively doped layer 7a which is contiguous to the positively doped layer 10a, the first of the above-mentioned active partial areas. The photo-resistive mask 25b covers about half of the polycrystalline layer 20a. The silicon nitride layer 25a is etched away outside the mask so that only a part 25c fo the silicon nitride layer 25a remains, as illustrated in FIG. 14. A heavy ion implantation with negative ions 26 is then carried out. Here the collector/emitter area of the FET is doped in the positively doped area 10a. At this ion implanation the silicon nitride layer 25c prevents ions from penetrating into the first active partial area of the second FET in the negatively doped area 7a. The second active partial area of the other FET, which is unprotected by the silicon nitride layer 25c, will also be heavily negatively doped at the ion implantatation. After the ion implantation, a silicon dioxide layer 27 is grown over the areas surrounding the silicon nitride layer 25c, as illustrated in FIG. 15. The silicon nitride layer 25c is etched away and heavy doping is carried out by implantation of positive ions 28 in the first active partial area thus uncovered of the FET in the negatively doped layer 7a. The silicon dioxide layer 27 is etched away and the surface of the device is coated with an electrically inslulating layer 29 of phosphor glass, as will be seen from FIG. 16. Holes 30 for electrical connections are etched in this glass layer with the aid of a photo-resistive mask. A metal layer 31, e.g. of aluminum with silicon and copper, is deposited over the phosphor glass layer 29. The metal layer 31 is etched to a pattern of conductors with the aid of a photo-resistive maks (not illustrated in the FIG. ). A further electrically insulating layer 32 of phosphor glass is deposited over the metal layer 31, as illustrated in FIG. 17. With the aid of a photo-resistive mask (unillustrated in the Figure) holes are etched in the layer 32, metallic exterior electrical connections 33 being arranged in the holes.

A bipolar transistor connected to a FET is achieved by the method described above. This circuit, which has been schematically illustrated in FIG. 1, is shown in more detail in FIG. 18. For the sake of clarity, the insulating phosphor glass layers 29 and 32 as well as the metal layer 31 and the exterior metallic connections 33 have not been shown in FIG. 18. The epitaxial layer 2a on the substructure 1 has been doped negatively as described in connection with FIGS. 2 and 3. This negative doping has been denoted by the symbol n on the layer 7a in FIG. 18. The silicon dioxide layer 16 has been described in connection with FIG. 9 and the silicon dioxide layer 19 has been described in connection with FIG. 10. The polycrystalline layers 20a and 20c as well as the LDD doping of the layer 7a have been described in connection with FIG. 11. The LDD doping has given rise to positively doped areas denoted by the symbol p in FIG. 18. The edge areas 23b have been described in connection with FIG. 12. According to the inventive method, there is achieved a heavily, positively doped area p+ and a heavily, negatively doped area n+ on either side of the polycrystalline layer 20a, as described in connection with FIGS. 13, 14 and 15. Th Darlington circuit has thus been provided with the bipolar npn transistor BIP and the field effect transistor FET. These transistors have been denoted by dashed lines in FIG. 18 and have been mentioned in connection with FIG. 1. The collector/emitter B of the FET consists of the heavily, positively doped area p+. The emitter E of the transistor BIP consists of the heavily, negatively doped area n+ and its collector K of the negatively doped area 7a. This area is electrically connected to the heavily doped polycrystalline layer 20c. The emitter E, collector K and collector/emitter B of the FET are provided with metallic connections, as illustrated in FIG. 17. Accordingly, with the aid of the above-described inventive menthod there has been provided a bipolar npn transistor and an FET connected to each other. In accordance with the invention, it is possible to connect a bipolar pnp transistor with an FET. In connection with FIG. 14 there is described how the silicon nitride layer 25a is etched away so that only the part 25c of the layer remains. In a corresponding way, the layer 25 can be etched so that only a part 25d above the layer 10a remains, as indicated by dashed line in FIG. 14. Doping and coating with silicon dioxide then takes place in a corresponding manner as described in connection with FIGS. 14 and 15 so that a pnp transistor connected to an FET is achieved.

Figure 9:
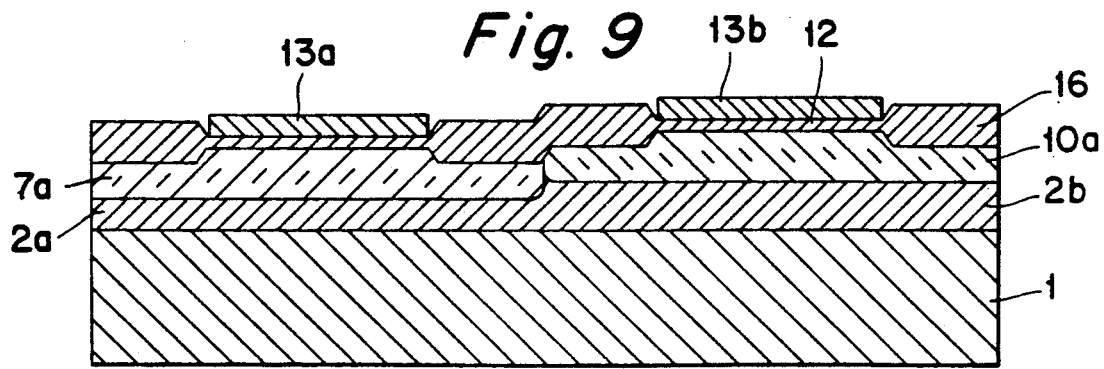

An alternative inventive method for producing a Darlington circuit with be described summarily below in connection with FIGS. 2-17. The method includes only the left hand parts of the Figures in which the Darlington circuit is produced. On the single crystalline silicon substructure 1 there is grown a weakly negatively doped epitaxial layer 2, the surface of which is oxidized to the silicon dixoide layer 3, according to FIG. 2. The negative phosphor ions 6 are implanted through the layer 3 so that the heavily doped surface layer 7 is formed, as illustrated in FIG. 3. This silicon dioxide layer 3 is further oxidized to the thick silicon dioxide layer 8, the phophor ions diffusion into the epitaxial layer 2a and forming the doped layer 7a, according to FIG. 4. As illustrated in FIG. 7, the silicon dioxide layer 8 is etched away and the layer 7a coated with the thin silicon dioxide layer 12. The silicon nitride layer 13 is deposited above the silicon dioxide layer 12 and the photo-resistive layer 14a is laid on the nitride layer 13. This nitride layer is etched away round the photo-resitive layer 14a, which is then removed. About the remaining part 13a of the nitride layer 13 the silicon dioxide layer 12 is further oxidized to the thick silicon dioxide layer 16, as illustrated in FIG. 9. The nitride layer 13a is etched away, the silicon dioxide layer 12 being attached at the same time. The thus exposed surface of the epitaxial layer 7a is once again oxidized to the thin, uniformly thick silicon dioxide layer 19, as illustrated in FIG. 11. The heavily doped polycrystalline silicon layer 20 is deposited on the oxide layers 16 and 19, the layer 20 being partially etched away by a photo-lithographic process, so that only parts 20a and 20c remain. The part 2/a of the polycrystalline layer 20 divides the active area into the two active, partial areas. The LDD doping with the positive ions 22 is carried out. As illustrated in FIG. 12, the silicon dioxide layer 23 is deposited, and then etched away to a major extent, so that only the edge areas 23a and 23b remain. The entire surface of the device is coated with the silicon nitride layer 25a, as illustrated in FIG. 13. This layer is coated with a photo-resistive mask 25b, and according to the invention, this only covers one half of the silicon nitride layer 25a on the first active partial area. This layer 25a is etched away in the area around the photo-resistive layer 25b so that only the part 25c of the silicon nitride layer remains, as illustrated in FIG. 14. The negative ions 26 are implanted on the second active partial area thus exposed on one side of the polycrystalline layer 20a. This area constitutes the emitter area E of the BIP transistor. The area round the silicon nitride layer 25c is oxidised to the oxide layer 27 and the silicon nitride layer 25c is etched away as illustrated in FIG. 15. The positive ions 28 are implanted in the surface of the first active partial area thus exposed. This positively doped area constitutes the collector/emitter B of the FET. The metal layer 31 is deposited on top of the phosphor glass layer 29, and the metal layer is subdivided by etching into a desired conductor pattern. The phosphor glass layer 32 is desposited on top of the metallic conductor pattern, and holes are etched in this layer 32 for the electrical connections 33 according to FIG. 17.

Figure 19:
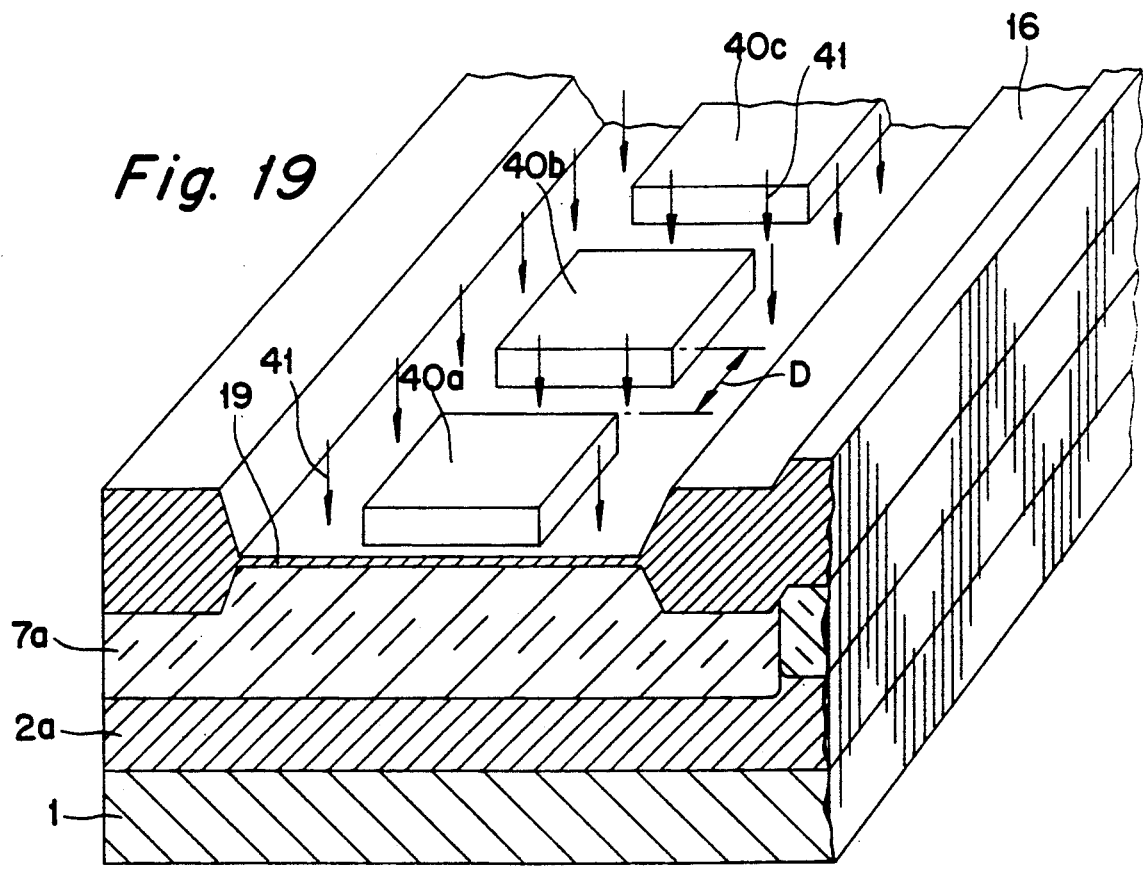

A further alternative method in accordance with the invention will now be described below in connection with FIGS. 19, 20 and 21.

In the same way as described in connection with FIGS. 2–11, the epitaxial layer 2a has been grown on the single crystal substructure 1 and the layer 2a has been doped negatively to the layer 7a. This layer has been oxidized to the thick silicon dioxide layer 11 surrounding the active area. The surface of the active area has been oxidized to the uniformly thck, pure silicon dioxide layer 19, and the heavily doped polycrystalline layer 20 has been deposited on top of it. According to this alternative method, the layer 20 is coated with a photoresistive mask. This mask permits parts of the layer 20 to be etched away so that only islands 40a, 40b, 40c remain of the layer 20. The distance between two adjacent islands is denoted by D, as illustrated in FIG. 19. The etching takes place anisotropically so that the islands 40a, 40b, 40c have straight and well-defined edges. The mask is removed and an unillustrated protective skin of silicon dioxide is grown on the islands. Positive ions 41 are implanted at a low concentration in the surface of the layer 7a, the active area, about the islands 40a, 40b and 40c. This implantation constitutes the above-mentioned LDD doping. A layer of silicon dioxide is deposited over the entire device in correspondence to the layer 23 in FIG. 12. The silicon dioxide layer is etched anisotropically so that only the edge area 42a, 42b of silicon dioxide remain about the islands 40a, 40b and 40c, as illustrated in FIG. 20. The distance D between the islands is so small, less than 1 μm, that the edge areas 42b completely cover the areas between the islands 40a, 40b and 40c. The islands and the intermediate edge areas 42b divide the active area in the first and second active partial areas as described above in connection with FIG. 11. In the same way as described above in connection with FIGS. 13, 14 and 15, the positive ions 28 are implanted in the first active partial area and the negative ions 26 in the second active partial area. The device provided with the phosphor glass layers 29 and 32, metal layer 31 and the electrical connections 33 in the way described above in connection with FIGS. 16 and 17.

Figure 20:
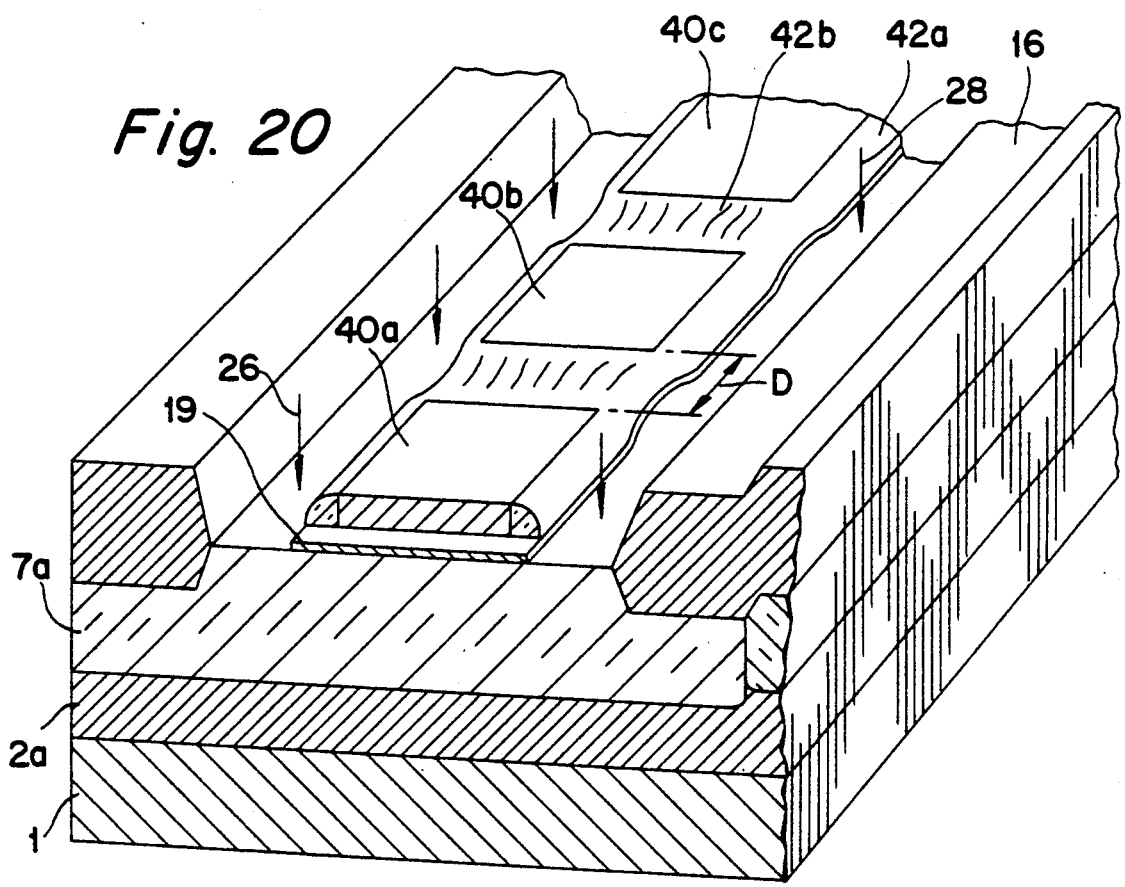
Figure 21:
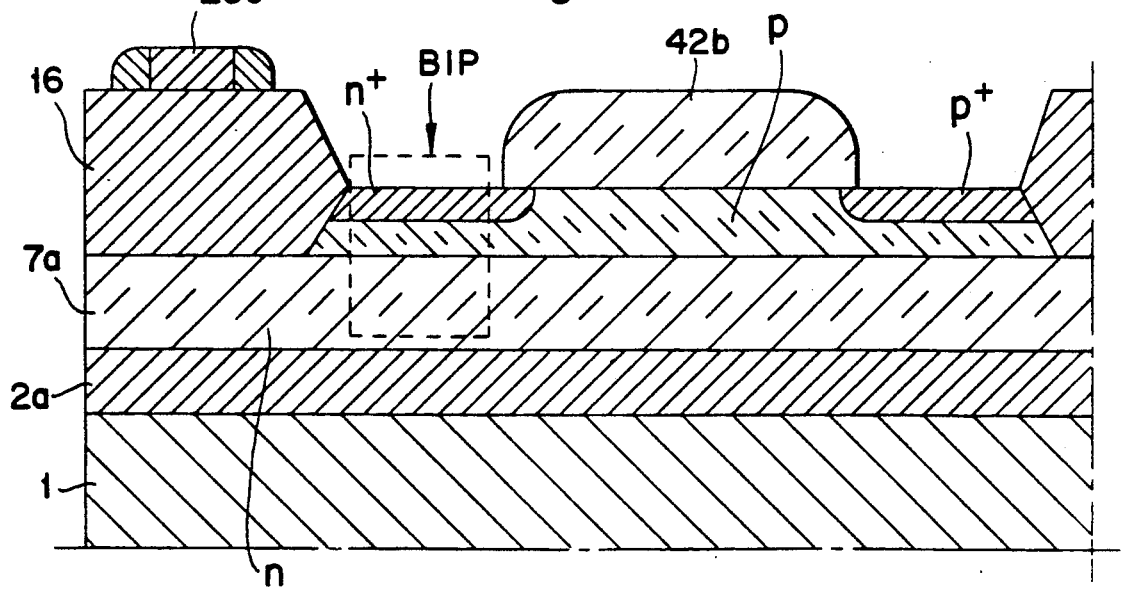
FIG. 21 illustrates in more detail a cross section of the layers in the device according to the alternative embodiment.

A cross section of the device in FIG. 20, through one of the intermediate edge areas 42b, is illustrated in FIG. 21.

Figure 18:
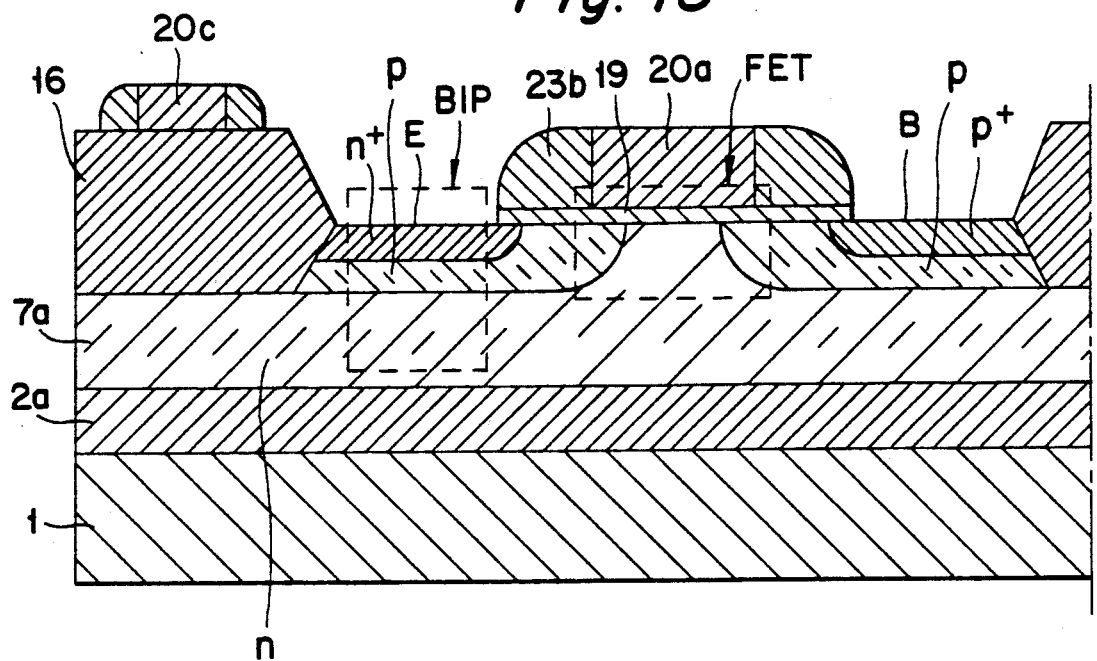
FIG. 18 shows in more detail a cross section of the layers in the transistors, FIGS. 19 and 20 each shwo, for an alternative embodiment perspectively from above, a semiconductor device with a cross section through the device.

This section differs from the cross section in FIG. 18 in that the area denoted by p, the LDD area, extends not only into the two active partial areas, but also between these partial areas under the intermediate edge areas 42b. This LDD area constitutes the base of the bipolar transistor BIP, which is denoted by dashed lines in the Figure. The base is connected via the heavily, positively doped first partial area p+. The emitter of the transistor BIP is the heavily, negatively doped second partial area n+ and its collector is the negatively doped epitaxial layer 7a, which can be connected electrically via the polycrystalline layer 20c. Under the islands 40a, 40b 40c the device has the appearance as in FIG. 18, and includes the bipolar transistor BIP and the field effect transistor FET. In the embodiment according to FIGS. 19, 20 and 21 the FET is not utilized however, but only the bipolar transistor BIP.

The individual procedural steps described above, e.g. coating with photoresistive masks, ion implantation or depositing silicon nitride are well knwon to one skilled in the art, and do not form any part of the invention. The materials mentioned are also well known, e.g. the silicon substructure 1. Other known semi-conductor materials, e.g., germaium, can also be used in the inventive methods. A part of the methods descrption above, up to and including the coating with the silicon layer 20a in FIG. 11, are also well known to one skilled in the art and constitute a part of the CMOS process mentioned in the introduction. The invention includes partially utilizing this known menthod in the manner described above for achieving in a simple way the two Darlington-connected transistors BIP and FET in FIG. 18, which have large amplification and are fast. The invention also includes a method of providing the bipolar transistor in FIG. 21. This transistor can be achieved in an enconomically advantageous way and the method can be carried out so that the transistor is provided with relatively good performance.

I claim:

1. Device with a bipolar transistor including a substructure of single crystal semiconductor material with an epitaxial layer of the semiconductor material, an area in the epitaxial layerr which is doped to a desired depth with doping substances of optionally positive or negative type, a thick semiconductor oxid layer surrounding an active area of the transistor and a thin layer of semiconductor oxide in the active area on which there is deposited layers of heavily doped polycrystalline semiconductor material which covers at least a part of the active area, wherein the polycrystalline layer is divided into islands on the active area, these islands being spaced from said thick semiconductor oxide layer and situated at a distance from each other, the islands have edge areas of semiconductor oxide, the edge areas completely covering the active area between the islands such that the active area is divided into a first and second active partial area, said thin layer of semiconductor oxid extends under the islands and under the edge areas, a weakly doped area extends down into the epitaxial layer from an underside of said edge areas of semiconductor oxide and out to the thick semiconductor oxide layer, the weakly doped area having the opposite doping tyep to the epitaxial layer, the second of the active partial areas, between said thick semiconductor oxide layer and the edge areas of semiconductor oxide on one side of the polycrystalline islands, is heavily doped with doping substances of the same type as the doping substances for the epitaxial layer and constitute a contact area of an emitter of the bipolar transistor, the first active partial area on the other side of the polycrystalline islands is heavily doped with doping substances of the opposite type to the doping substances in the epitaxial layer and constitutes the contact area for a base of the pipolar transistor, and the epitaxial layer which constitutes a collector of the bipolar transistor, said contact areas for the base and the emitter are each connected to an electrically conductive outside connection.

* * * * *